United States Patent [19]

Otani et al.

[11] Patent Number: 5,452,332
[45] Date of Patent: Sep. 19, 1995

[54] AGC CIRCUIT FOR BURST SIGNAL

[75] Inventors: Susumu Otani; Hiroki Tsuda; Setomi Uchikawa; Colin Smith, all of Tokyo, Japan

[73] Assignee: NEC Corporation, Japan

[21] Appl. No.: 184,245

[22] Filed: Jan. 19, 1994

[30] Foreign Application Priority Data

Jan. 20, 1993 [JP] Japan .................................. 5-007850
Jan. 20, 1993 [JP] Japan .................................. 5-007945

[51] Int. Cl.⁶ .......................................... H04L 27/08
[52] U.S. Cl. .................................... 375/345; 330/254; 455/232.1; 455/234.1
[58] Field of Search ............ 375/98; 455/232.1, 234.1, 455/234.2, 235.1, 239.1, 240.1, 245.1; 330/254

[56] References Cited

U.S. PATENT DOCUMENTS 5,040,194  8/1991  Tjahjadi et al. ............. 455/234.1 X
5,170,915  12/1992  Yoshida et al. ........................ 375/80

Primary Examiner—Stephen Chin
Assistant Examiner—Bryan Webster
Attorney, Agent, or Firm—Ostrolenk, Faber, Gerb & Soffen

[57] ABSTRACT

An intermittently transmitted burst modulation signal is demodulated to a baseband signal and multiplied with a variable gain coefficient. A range where a difference signal of a power signal of the multiplied signal from a reference power level is included, in a plurality of level ranges, is decided. A loop constant is determined in accordance with the decided range and is multiplied with the difference signal. An integrated multiplied difference signal with the loop constant is used for changing the variable gain constant.

8 Claims, 4 Drawing Sheets

| AREA DECISION OUTPUT | | INPUT VOLTAGE (IV) |
| --- | --- | --- |
| C1 | C2 | |
| 0 | 0 | R2 < IV |
| 0 | 1 | R3 ≤ IV ≤ R2 |
| 1 | 0 | IV < R3 |

| INPUT CODE | | OUTPUT VALUE |
|---|---|---|
| C1 | C2 | |
| 0 | 0 | K1 |
| 0 | 1 | K2 |
| 1 | 0 | K3 |

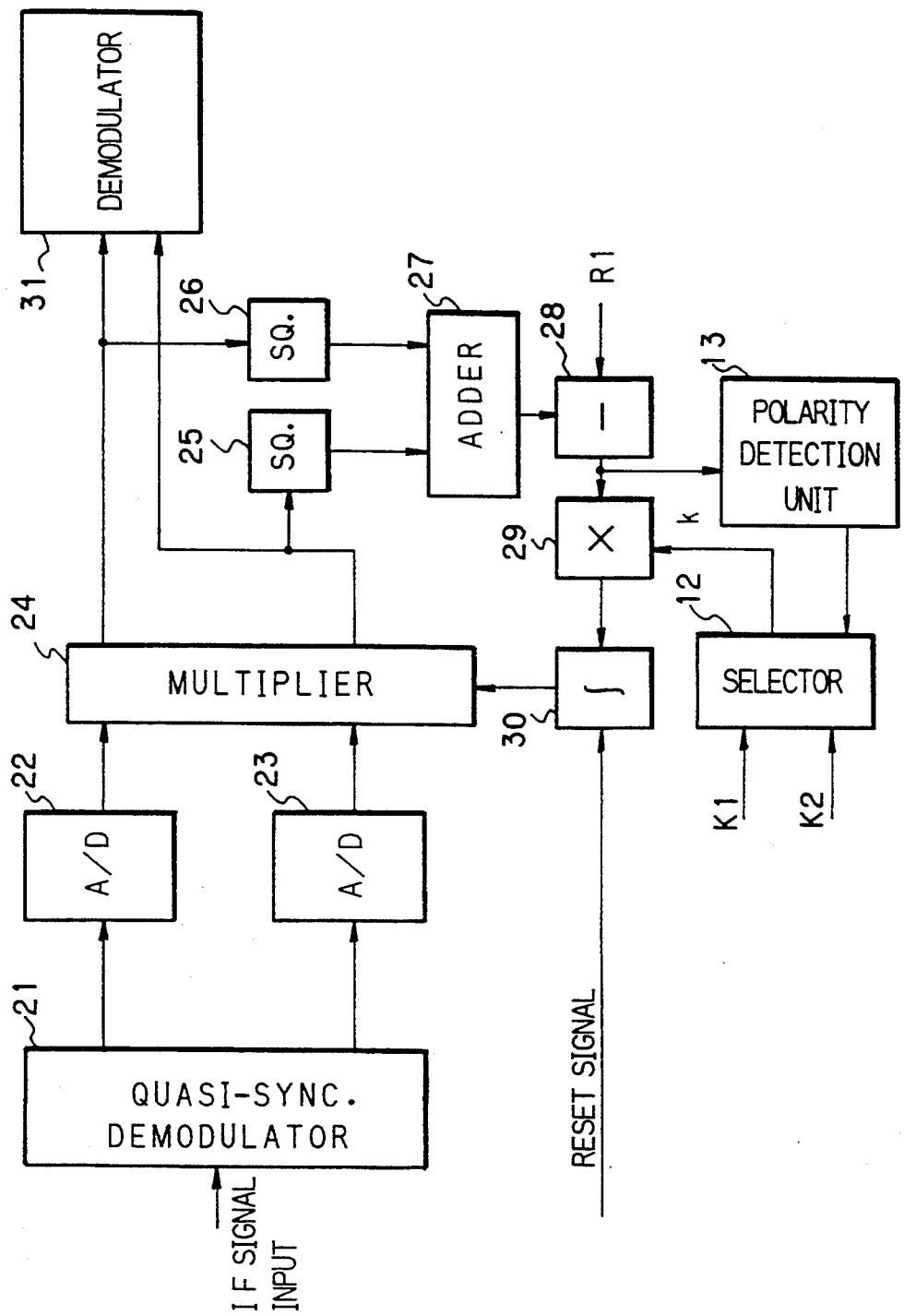

AGC CIRCUIT FOR BURST SIGNAL

BACKGROUND OF THE INVENTION

The present invention relates to an AGC circuit for burst signal in a burst signal demodulator such as voice activation, slotted aloha, TDMA, etc.

In satellite communication system such as voice transmission, a voice activation method, which operates according to a speaker's intermittent voice generation characteristic such as to transmit a signal when there is a voice and transmit no signal when there is no voice is useful for effective utility of satellite power and is extensively employed. Such signal modulation wave is an intermittently transmitted signal, i.e., a burst signal. Therefore, a burst demodulator is required on the receive side.

When the opposite station is changed, a received level in the receive side is varied with variations of the communication channel transmission loss (each station base). Generally, with received level variations the loop gain of the demodulator's carrier recovery circuit or the clock recovery circuit is varied, and a stable demodulation operation can not longer be obtained. Therefore, an AGC operation for maintaining a constant received signal level is required.

FIG. 6 shows a block diagram of a conventional AGC circuit. A quasi-synchronization 21 receives an intermittently transmitted burst modulated signal (IF input signal) for quasi-synchronization demodulation with orthogonal carrier wave signals which are substantially equal in frequency to the carrier wave frequency to obtain two quadrature channels of analog type. A/D converters 22 and 23 convert the two output signals from the quasi-synchronization demodulator 21 into respective digital data series consisting of a plurality of bits. The digital data series obtained by the A/D converters 22 and 23 are applied to a multiplier 24. The output of the multiplier 24 is supplied to a demodulator 31 using a DSP (Digital Signal Processor), and also to square circuits 25 and 26. The received signal level is obtained by squaring the respective outputs of the multiplier 24. The received signal level of the data series obtained by the squaring circuits 25 and 26 are added together in an adder 27 to obtain the received signal power of the outputs of the multiplier 24. A subtractor 28 subtracts an output signal level of the adder 27 from the reference value R1 to be set by the AGC loop. The difference value of the output of the subtractor 28 is multiplied by a multiplier 29 with a loop gain constant k which determines the AGC loop gain, and the multiplied result is applied to an integrator 30. The integrator 30 integrates the output of the multiplier 29 and drives the multiplier 24. The AGC loop is thus established in order to minimize the output value of the subtractor 28.

In the AGC loop, the AGC response time is determined by the loop gain constant k; the response time becomes shorter with the greater gain constant k and becomes longer with less loop gain constant k.

In the conventional AGC circuit for burst signal, it has been generally necessary to decrease the response time of the loop to cope with the burst signal. However, since decreasing the loop response time is equivalent to increasing the loop band, the receive level variation components that are superimposed on the received signal also pass through the loop. Such components are coupled to the received signal in the multiplier, thus deteriorating the signal quality. For this reason, there is a limit imposed on the response time for coping with the burst signal.

SUMMARY OF THE INVENTION

An object of the invention is therefore to provide an AGC circuit for burst signal capable of a high quality demodulation.

Another object of the invention is to provide an AGC circuit for burst signal, in which the AGC loop has a high speed response characteristic when a high speed synchronization is necessary in the initial state, while the AGC loop band becomes minimum and the loop noise vanished after the high speed response state.

According to one aspect of the present invention, there is provided an AGC circuit for burst signal comprising a quasi-synchronization demodulator for receiving an intermittently transmitted burst modulation signal and demodulating the burst modulation signal to a baseband signal, an analog-to-digital converter for converting the output signal of the quasi-synchronization modulator to a digital signal, a first multiplier for receiving the output signals of the analog-to-digital converter and an integrator and executing a multiplying operation, two square circuits for squaring the output signal of the first multiplier, an adder circuit for adding the output signals of said square circuits, a digital subtractor for subtracting a predetermined reference signal from the output of said adder circuit, an area decision unit for deciding three different areas defined by comparing a first and a second reference predetermined value with the level of the subtractor output signal, a selector for receiving the output signal of the area decision unit and selecting predetermined three different loop constants K1 to K3, a second multiplier for multiplying the output signals of the selector and the subtractor, and the integrator for integrating the output signal of the second multiplier to drive the first multiplier, the loop constants K1 to K3 being related as $K1 >> K2 \geq K3$, the first reference value being set to be greater than the second reference value, the selector selecting the loop constant K1 when the output signal of the subtractor is greater than the first reference value, selecting the loop constant K3 when the output signal of the subtractor is less than the second reference value and selecting the loop constant K2 when the output signal of the subtractor has an intermediate value between the first and second reference values.

According to another aspect of the present invention, there is provided an AGC circuit for burst signal comprising a quasi-synchronization demodulator for receiving an intermittently transmitted burst modulation signal and demodulating the burst modulation signal to a baseband signal, an analog-to-digital converter for converting the output signal of the quasi-synchronization demodulator to a digital signal, a first multiplier for receiving the output signals from the analog-to-digital converter and an integrator and executing a multiplying operation, a square circuit for squaring the output signal of the first multiplier, an adder circuit for adding the output signals of said square circuits, a digital subtractor for subtracting a predetermined reference signal from the output of the square circuit, a digital polarity detection circuit for detecting a polarity of the output signal of the subtractor, a selector for selecting a loop constant K1 when it is detected by the polarity detection circuit that the output signal of the subtractor is positive and selecting a loop constant K2 ($K1 >> K2$) when the output signal of the subtractor is negative, a second multiplier for multiplying the output signals of the selector and the subtractor, and an integrator for integrating the output signal of the second multiplier to drive the first multiplier. In the above AGC circuit, the integrator is reset at the time of the start of communication.

According to other aspect of the present invention, there is provided an AGC system for burst signal comprising steps of a first step for quasi-demodulating an intermittently transmitted burst modulation signal to a baseband signal, a second step for multiplying the baseband signal with a variable gain coefficient, a third step for obtaining a received level by using the multiplied signal, a fourth step for deciding a range, where a difference signal of the receive level signal from a reference level is included, in a plurality of level ranges, a fifth step for determining a loop constant in accordance with the judged range, a sixth step for multiplying the difference signal with the determined loop constant, a seventh step for integrating the multiplied difference signal with the loop constant, and an eighth step for changing the variable gain constant in the second step. In the above AGC circuit, the integrated value in the seventh step is reset at the time of the start of communication.

Other objects and features will be clarified from the following description with reference to attached drawings.

BRIEF DESCRIPTION OF THE DRAWINGS

FIG. 4 shows a time chart for explaining a reset timing of the integrator 30 in the embodiments;

FIG. 5 shows a block diagram showing a second embodiment of the present invention.

DETAILED DESCRIPTION OF THE PREFERRED EMBODIMENTS

Now, a first embodiment of the invention will be described with reference to the drawings.

Figures 1, 2:
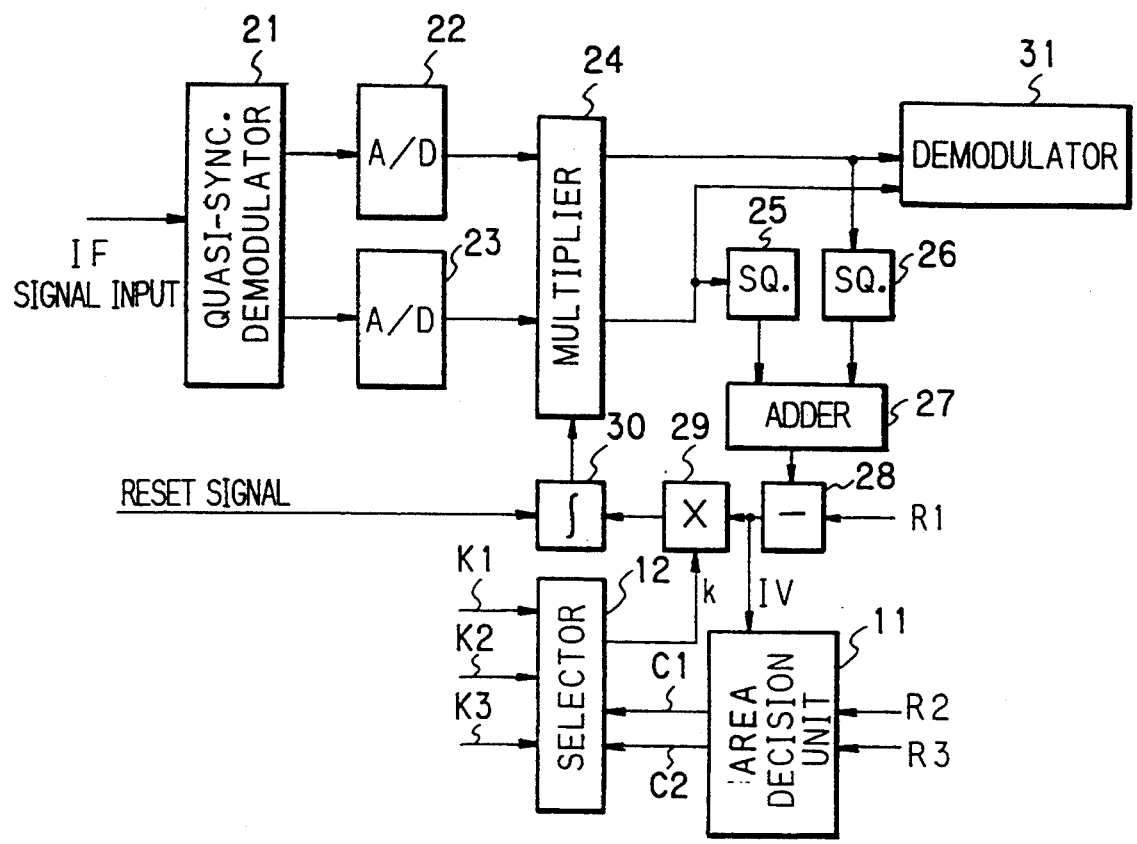
FIG. 1 shows a block diagram showing a first embodiment of the present invention.
FIG. 2 shows a table for explaining the operation of the area decision unit 11 in FIG. 1.
Figure 6:
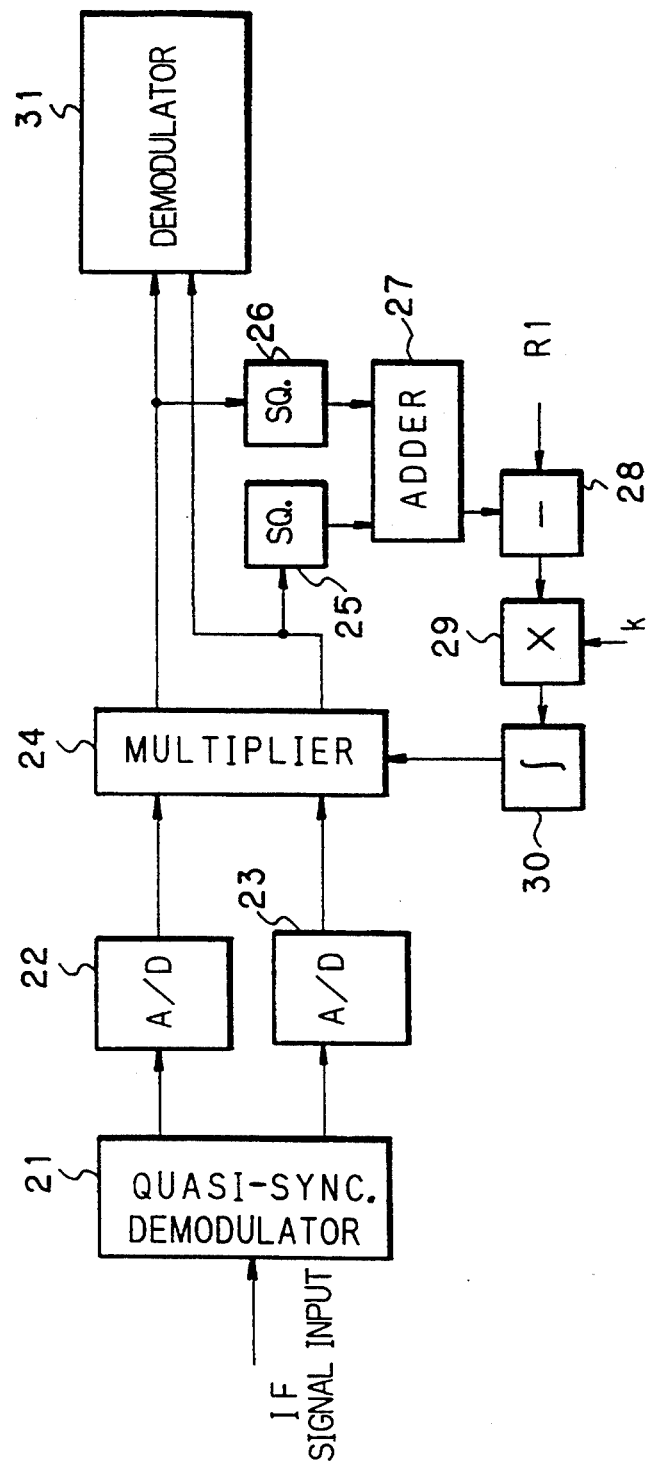
FIG. 6 shows a block diagram of a conventional AGC circuit.

FIG. 1 is a block diagram showing a first embodiment. In this embodiment, parts like those in the AGC circuit shown in FIG. 6 are designated by like reference numerals. In this embodiment of FIG. 1, an area decision unit 11 and a selector 12 are added to the system shown in FIG. 6.

The area decision unit 11 converts the output signal of the subtractor 28 into a three-state signal by comparing the output signal level with reference values R2 and R3. The output signal IV from the subtractor 28 is decided with respect to the reference values R2 and R3 as in FIG. 2. Shown at C1 and C2 are two bits data of the output signal of the area decision unit 11. The reference value R2 is set to be greater than the reference value R3. The area decision unit 11 sets C1 to "0" and C2 to "0" if the output signal IV of the subtractor 28 is greater than the reference value R2, sets C1 to "1" and C2 to "0" if the output signal IV of the subtractor 28 is less than the reference value R3, and sets C1 to "0" and C2 to "1" if the output signal IV of the subtractor 28 has an intermediate value between the reference values R2 and R3.

Figures 3, 4A, 4B:
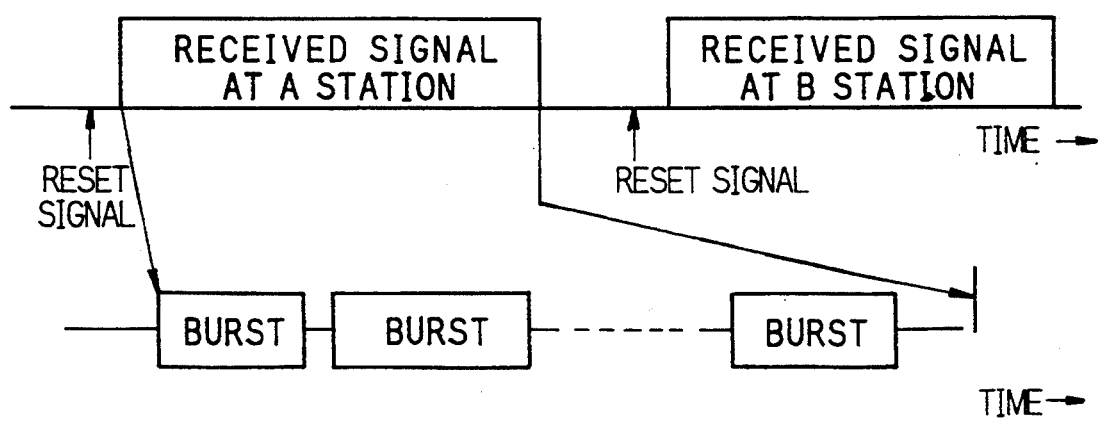
FIG. 3 shows a table for explaining the operation of the selector 12 in FIG. 1.

The selector 12 receives the output signal of the subtractor 28 and selects either one of loop constants K1 to K3 as shown in FIG. 3 in accordance with the input codes C1 and C2. The loop constants K1 to K3 are set as $K1 \gg K2 \geqq K3$. As shown in FIG. 3, the selector 12 selects the loop constant K1 if C1 and C2 are both "0", selects the loop constant K2 if C1 and C2 are respectively "0" and "1" and selects the loop constant K3 if C1 and C2 are respectively "1" and "0".

Consequently, the selector 12 selects the loop constant K1 if the output signal of the subtractor 28 is greater than the reference value R2, selects the loop constant K3 if the output signal of the subtractor 28 is less than the reference value R3, and selects the loop constant K2 if the output signal of the subtractor 28 has an intermediate value between the reference values R2 and R3. The signal selected by the selector 12 is supplied to the multiplier 29 for determining the gain of the AGC loop.

The first embodiment will now be described in greater detail.

Before receiving the signal, the received power is small because at this time at most noise component present in the channel is received. Thus, the output value of the adder 27 is less than the reference value R1, and the subtractor 28 generates a negative output. If the output level of the subtractor 28 is less than the reference value R3, the area decision unit 11 executes the decision operation based upon the reference values R2 and R3 and outputs C1=1 and C2=0, as shown in FIG. 2. The selector 12 executes the selection operation based upon a table as shown in FIG. 3, and selects a loop constant K3. This loop constant K3 is input to the multiplier 29. If K1 to K3 are related as $K1 \gg K2 \geqq K3$ as noted above, the AGC loop band is held minimum. The output signal of the multiplier 29 is negative (that is small input signal) even though the K3 has a small value. The input to the integrator 30 thus controls the multiplier 24 to provide for the maximum gain so as to increase the input signal.

In the voice communication or the like, the actual communication is started after the communication channel has been designated by a signaling signal at the time of the start of the communication. In this case, it is possible to set the value of the integrator 30 such as to maximize the gain of the multiplier 24 by using a reset signal supplied to the integrator 30. This operation is shown in FIGS. 4(a) and 4(b). FIG. 4(a) shows an operation in case when the demodulator first communicates with station A and then communicates with station B. In this case, the rest signal is supplied before the start of the communication. When making communication with station B after the communication with station A has been ended, a reset signal is input prior to the start of the communication. FIG. 4(b) shows a case when the burst signal is transmitted on the basis of generation of the talker's speech in station A.

Since the maximum gain has been set in the multiplier 24, upon reception of signal a large voltage is generated in the adder 27. The output of the subtractor 28 thus becomes a large positive value. If the output level exceeds the reference value R2 in the logic shown in FIG. 2, C1=0 and C2=0 are given as an area decision, and the selector 12 is controlled such as to select loop constant K1 according to the table of FIG. 3. Since K1 has a large value, after it has been input to the multiplier 29, the AGC loop is made to be a high speed loop.

Thus, a high speed response operation is realized. With the high speed response of the loop, the signal power supplied from the multiplier 24 to the demodulator is quickly brought to be coincident with the reference value R1. The output of the subtractor 28 thus takes a small value as absolute value. If this signal is less than the reference value R2 and greater than the reference value R3, the output codes are C1=0 and C2=1, and the selector 12 is controlled such that the loop constant K2 is selected. At this time, since K2 is sufficiently small compared with the loop constant K1, the noise in the AGC loop is sufficiently small, and the deterioration of signal can be suppressed to a minimum. Thus, when a high speed synchronization is required, a large AGC loop band is provided, and after a pull-in the AGC loop band is reduced to minimize the deterioration of signal.

Now, a case will be explained, in which the received burst vanishes.

When the received signal vanishes, the output of the subtractor 28 is held at a negative value. In many cases, at this moment the output of the subtractor 28 becomes less than the reference value R3, and the selector 12 selectively provides the loop constant K3 to the multiplier 29. Since the loop constant K3 is sufficiently small, only a very small value is supplied to the integrator 30 subsequent to the multiplier 29. Thus, the output of the integrator 30 is held substantially at a constant value for a long time (compared with the interval of the voice activation signal burst). The gain of the multiplier 24 is thus held substantially at the same value as when there is a burst signal.

Thus, when a signal is subsequently received, the gain of the multiplier 24 is held to be substantially ideal, and the time required for the next pull-in is extremely reduced. If the input signal is great compared with the previous burst, the loop constant K1 is selected to provide for high speed response of the AGC loop as noted above. If the input signal is less compared with the previous burst, however, time-consuming response is liable. In the voice activation or like system, the transmitting station is the same, and the level difference is small and has substantially no influence on the subsequent demodulator.

However, depending on the like, when the next received burst level may be reduced considerably to have adverse effects on the demodulator operation, the reference value R3 is set in the lower range of the demodulator. In such a case, the signal which is received once again is between the reference values 2 and 3, and the area judging unit 11 outputs codes C1=0 and C2=1. Thus, the loop constant K2 is supplied to the multiplier 29 according to table shown in FIG. 2. In this case, the level deviation from the desired level is greatly small compared with that at the time of the initial reception. Thus, the loop band need not be considerably great (that is, there is no need to follow high speed). Thus, the loop constant K2 is set to a value which is greatly smaller than the loop constant K1 and greater than the loop constant K3.

Thus, even if the next burst is less than the desired value, the demodulator is immediately set to a level permitting stable operation.

Now, a second embodiment of the invention will be described with reference to the drawings.

FIG. 5 shows a block diagram showing a second embodiment of the present invention. In the embodiment of FIG. 5, parts like those shown in FIG. 6 are designated by like reference numerals. The embodiment of FIG. 5 is formed by adding a selector 12 and a polarity detection unit 13 to the structure shown in FIG. 6.

The polarity detection unit 13 receives the output signal of the subtractor 28 which detects the difference between a reference value R1 and the received level, and detects the polarity of the input. The detected polarity signal is applied to the selector 12. The selector 12 selects the loop constant K1 if the polarity of the polarity detection unit 13 is positive and selects the loop constant K2 if the polarity of the polarity detection unit 13 is negative. Here K1>>K2. The selected loop constant K1 or K2 is input to the multiplier 29, which determines the AGC loop gain.

Now, the second embodiment will be described in detail. Before receiving the signal, the received power is low because at this time at most noise component present in the channel is received. Thus, the output value of the adder 27 is less than the reference value R1, and the polarity detection unit 13 generates a negative output. The polarity detection unit 13 thus generates a negative signal, and the selector 12 generates the loop constant K2 as its output. The subtractor 28 provides the loop constant K2 as its output. Thus, if the loop constant K2 meets K2<<K1 and can hold the loop band to be narrow, the AGC loop waits with a low speed response characteristic. However, since no signal has been received, the multiplier 24 normally has a maximum gain. When voice is first started in voice communication or the like, the actual communication is started after a communication channel has been designated by a signaling signal. In this case, it is possible to set the value of the integrator 30 shown in FIG. 5 to a value which maximizes the gain of the multiplier 24 by using the reset signal supplied to the integrator 30.

This operation is also shown in FIG. 4 as in the operation of the first embodiment.

When a signal is received, a high voltage is generated from the adder 27. The output of the subtractor 28 thus becomes positive, and the loop constant K1 is set as a constant in the multiplier 29 by the polarity detection unit 13 and the selector 12. The loop constant K1 is sufficiently larger than the loop constant K2, that is K1<<K2, and the loop band is widened. Thus, the AGC band is widened and the high speed response to the input signal is realized. With the high speed response of the loop, the signal power that is input to the demodulator 31 from the multiplier 24 rapidly becomes coincident with the reference value R1, and thus the output signal of the subtractor 28 becomes zero. When the output signal of the subtractor 28 becomes zero, the output of the polarity detection unit 13 becomes negative, and the selector 12 is controlled to select the loop constant K2. Since at this time the loop constant K2 is sufficiently small compared with K1, the noise in the AGC loop is sufficiently small, and the signal deterioration is held minimum. Thus, when the high speed synchronization is required, the AGC loop band is increased, and after a pull-in the AGC loop band is reduced to minimize the signal deterioration.

Next, a case in which the received burst vanishes will be explained.

When the received signal vanishes, the output of the subtractor 28 is held negative, and thus the loop constant K2 remains set in the subtractor 29. Since the loop constant K2 is sufficiently small, the subtractor 30 subsequent to the multiplier 29 is supplied with only a very small value. The value of the subtractor 30 is thus held substantially constant for a long time. Thus, the gain of the multiplier 24 is held substantially at the same value as when there is a burst signal.

When the next signal is received, the gain of the multiplier 24 is held to be substantially ideal, and thus the time required for the next pull-in is extremely reduced. When the input signal is low compared with the previous burst signal, the response takes time. However, in the voice activation or like system the transmitter earth station is the same. Thus, the level difference is small and has no effect on the subsequent demodulator. Further, in the TDMA or other system the level difference between adjacent bursts is at most about 3 dB and has substantially no effect on the demodulator.

According to the invention, when the high speed synchronization is necessary in the initial stage, the AGC loop has the high speed response characteristic, and after the high speed response the AGC loop band becomes minimum, and also the influence of the loop noise vanishes. Further, according to the present invention, with the vanishing of the burst signal after the reception thereof, the AGC loop band is set to be minimum, thus setting the gain of the gain control multiplier with respect to the previous burst level. Thus, when next burst signal is received, it is possible to supply a value close to the desired level from the outset to the demodulator. Further, according to the present invention, if there is a slight level difference between adjacent bursts, and the intermediate loop band is selected to absorb the inter-burst deviation.

What is claimed is:

1. An AGC circuit for burst signal comprising a quasi-synchronization demodulator for receiving an intermittently transmitted burst modulation signal and demodulating said burst modulation signal to a baseband signal, two analog-to-digital converters for converting the output signal of said quasi-synchronization demodulator to a digital signal, a first multiplier for receiving the output signals of said analog-to-digital converters and an integrator and executing a multiplying operation, two square circuits for squaring the output signal of said first multiplier, an adder circuit for adding the output signal of said square circuits, a digital subtractor for subtracting a predetermined reference signal from the output of said adder circuit, an area decision unit for deciding three different areas defined by comparing a first and a second reference predetermined values with the level of said subtractor output signal, a selector for selecting one of predetermined three different loop constants K1, K2 and K3 based upon the output signal of said area decision unit, a second multiplier for multiplying the output signals of said selector and said subtractor, and the integrator for integrating the output signal of said second multiplier to drive said first multiplier thereby, said loop constants K1, K2 and K3 being related as $K1 >> K2 \geq K3$, said first reference value being set to be greater than said second reference value, said selector selecting said loop constant K1 when the output signal of said subtractor is greater than said first reference value, selecting said loop constant K3 when the output signal of said subtractor is less than said second reference value and selecting said loop constant K2 when the output signal of said subtractor has an intermediate value between said first and second reference values.

2. The AGC circuit for burst signal according to claim 1, wherein said integrator is reset at the time of the start of communication.

3. An AGC circuit for burst signal comprising a quasi-synchronization demodulator for receiving an intermittently transmitted burst modulation signal and quasi-demodulating said burst modulation signal to a baseband signal, an analog-to-digital converter for converting the output signal of said quasi-synchronization demodulator to a digital signal, a first multiplier for receiving the output signals of said analog-to-digital converter and an integrator and executing a multiplying operation, two square circuits for squaring the output signal of said first multiplier, an adder circuit for adding the output signals of said square circuits, a digital subtractor for subtracting a predetermined reference signal from the output of said adder circuit, a digital polarity detection circuit for detecting a polarity of the output signal of said subtractor, a selector for selecting a loop constant K1 when it is detected by said polarity detection circuit that the output signal of said subtractor is positive and selecting a loop constant K2 ($K1 >> 1K2$) when the output signal of said subtractor is negative, a second multiplier for multiplying the output signals of said selector and said subtractor, and the integrator for integrating the output signal of said second multiplier to drive said first multiplier thereby.

4. The AGC circuit for burst signal according to claim 3, wherein said integrator is reset at the time of the start of communication.

5. An AGC system for burst signal comprising steps of;
 a first step for quasi-demodulating an intermittently transmitted burst modulation wave signal to a baseband signal;
 a second step for multiplying the baseband signal with a variable gain coefficient;
 a third step for obtaining a received signal level by using the multiplied signal;
 a fourth step for deciding a range, where a difference signal of the received signal level from a reference level is included, in a plurality of level ranges;
 a fifth step for determining a loop constant in accordance with the decision range;
 a sixth step for multiplying said difference signal with the determined loop constant;
 a seventh step for integrating the multiplied difference signal with the loop constant; and
 an eighth step for changing said variable gain constant in said second step.

6. An AGC circuit for burst signal as set forth in claim 1, wherein the integrated value in said seventh step is reset at the time of the start of communication.

7. An AGC method for burst signal as set forth in claim 5, wherein said plurality of level ranges are defined by a first reference value and a second reference value larger than said first reference value, and said loop constants are K1 to K3 which are related as $K1 >> K2 \geq K3$.

8. An AGC method for burst signal as set forth in claim 5, wherein said plurality of level ranges are defined by a reference value, and said loop constants are K1 and K2 which are related as $K1 >> K2$.

* * * * *